United States Patent
Huang et al.

(10) Patent No.: US 11,444,182 B2
(45) Date of Patent: Sep. 13, 2022

(54) FIN SEMICONDUCTOR DEVICE AND METHOD FOR MAKING THE SAME

(71) Applicant: SHANGHAI HUALI INTEGRATED CIRCUIT CORPORATION, Shanghai (CN)

(72) Inventors: Qiuming Huang, Shanghai (CN); Jun Tan, Shanghai (CN); Qiang Yan, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/327,485

(22) Filed: May 21, 2021

(65) Prior Publication Data
US 2021/0376131 A1    Dec. 2, 2021

(30) Foreign Application Priority Data
May 29, 2020   (CO) .......................... 202010476301.7

(51) Int. Cl.
*H01L 29/66*    (2006.01)
*H01L 21/8234*  (2006.01)
*H01L 29/78*    (2006.01)

(52) U.S. Cl.
CPC .............. *H01L 29/66795* (2013.01); *H01L 21/823412* (2013.01); *H01L 21/823431* (2013.01); *H01L 29/7851* (2013.01)

(58) Field of Classification Search
CPC ............. H01L 29/785; H01L 29/42392; H01L 21/324; H01L 21/30604; H01L 21/3081
See application file for complete search history.

(56) References Cited

U.S. PATENT DOCUMENTS

2007/0158756 A1* 7/2007 Dreeskornfeld .. H01L 29/66818
                                                     257/374
2017/0005190 A1* 1/2017 Chang ............... H01L 29/78696

* cited by examiner

*Primary Examiner* — Changhyun Yi
(74) *Attorney, Agent, or Firm* — Alston & Bird LLP (57) ABSTRACT

A manufacturing method of a fin semiconductor device is disclosed. The method includes: providing a substrate; etching the substrate the first time to form a fin channel structure which protrudes from the substrate; forming a protective oxide layer on two sidewalls and the top surface of the fin channel structure; etching a the second time to form the base part of the fin channel structure, wherein the base part is not covered by the protective layer; oxidizing the base part of the fin channel, when the upper part of the fin channel is blocked from oxidation by the protective layer; removing both the protective layer and the oxidized base part of the fin channel structure, so that the upper part of the fin channel structure is suspended over the substrate.

9 Claims, 4 Drawing Sheets

FIN SEMICONDUCTOR DEVICE AND METHOD FOR MAKING THE SAME

CROSS-REFERENCES TO RELATED APPLICATIONS

This application claims the priority to Chinese patent application No. CN202010476301.7, filed on May 29, 2020, and entitled "FIN SEMICONDUCTOR DEVICE AND METHOD FOR MAKING THE SAME", the disclosure of which is incorporated herein by reference in its entirety.

TECHNICAL FIELD

The present application relates to the field of semiconductor devices and manufacturing, in particular, to a fin semiconductor device and a manufacturing method thereof.

BACKGROUND

Since the early days when Dr. Jack Kilby of Texas Instruments invented the integrated circuits, scientists and engineers have made numerous inventions and improvements in all aspects of semiconductor devices and processes. The sizes of semiconductor devices have been significantly reduced in the past 50 years, thanks to continuous increases in processing speeds and continuous reductions in power consumption. The development of semiconductor devices has consistently followed the Moore's Law up to this now. Moore's Law perceives that the number of transistors in a microchip doubles approximately every two years though the cost of computers is halved. Currently, the semiconductor process is developing towards a node below 20 nm, and people are working on the 14-nm process. A reference is provided herein, the diameter of a silicon atom is about 0.2 nm, which means that the distance between two components at two ends of a pitch manufactured by means of the 20-nm process is only about the sum of the diameters of a hundred silicon atoms. Therefore, manufacturing of semiconductor devices has become increasingly challenging approaching towards the feasible physical limit.

With development of integrated circuits, device sizes have become increasingly small, meanwhile the integration level has become increasingly high. Continuous decrease of the critical dimensions of semiconductor devices has challenged the conventional planar semiconductor manufacturing technologies to be inapplicable, therefore non-planar technologies have emerged in the semiconductor devices and processes, for example, new processes such as silicon-on-insulator, double-gate, multi-gate, and 3D devices have occurred. Recently, the fin field-effect transistors (FinFET) have been fabricated in the field of small-sized devices, and also devices having all-around gate structures are also pursued by the semiconductor industry because of their unique performance in suppressing the short channel effect effectively. As a all-around gate device channel is surrounded by the gate, the impact of the short channel effect is eliminated. In addition, the device's electric leakage and punch-through issues are effectively suppressed. The manufacturing process of the all-around gate device is relatively complicated because the gate is suspended over the substrate.

In view the above, there is an urgent need for a method for manufacturing a fin semiconductor device, whereby a suspended fin channel can be formed via a simpler technical process than the existing one, and thereby forming a suspended all-around gate gate over the substrate, so as to improve the device performance, reduce the process complexity, and control the manufacturing cost.

BRIEF SUMMARY

A brief overview of one or more aspects is provided below to provide a basic understanding of the disclosure. The overview is not detailed and comprehensive for all the conceived embodiments. It is neither intended to identify the key or decisive elements of all the aspects, nor attempted to define the scope of any or all of the details of the embodiments. The sole purpose is to present some concepts of one or more aspects in a simplified form as a prelude to the more detailed description provided subsequently.

all-around gate substrate One embodiment of the present application provides a method for manufacturing a fin semiconductor device, comprising steps of: providing a substrate; etching the substrate to form a fin channel structure for a first time, wherein the fin channel structure protrudes from the substrate; forming a protective layer on a top surface and two sidewalls of the fin channel structure, wherein the protective layer comprises silicon oxide; etching the substrate for a second time to extend the fin channel structure deeper into the substrate, wherein the fin channel structure comprises an upper part under the protective layer and a base part not covered with the protective layer; oxidizing the base part of the fin channel structure, without affecting the upper part of the fin channel structure; removing the protective layer from the fin channel structure; and removing the oxidized base part of the fin channel structure to suspend the upper part of the fin channel structure over the substrate.

In some examples, etching the substrate for a second time comprises steps of: performing a vertical dry etch on the substrate to extend the fin channel structure deeper into the substrate to form the base part of the fin channel structure; and performing a lateral dry etch on the base part of the fin channel structure to reduce a width of the base part.

In some examples, the substrate comprises a first dielectric layer on a upper surface of the substrate and a barrier layer on a upper surface of the first dielectric oxide layer, wherein the first dielectric layer comprises oxide and the barrier layer comprises nitride; wherein etching the substrate for the first time comprises steps of: etching the substrate to form the fin channel structure, wherein the fin channel structure remains under the first dielectric layer and the barrier layer; and wherein forming the protective layer comprises: forming the protective layer on a top surface and two side walls of the fin channel structure.

In some examples, the etching the substrate for the first time further comprises: etching the first dielectric layer and the barrier layer from the surface of the substrate; and wherein removing the protective layer and removing the oxidized base part of the fin channel structure further comprises: removing the first dielectric layer.

In some examples, removing the protective layer and the oxidized base part of the fin channel structure further comprises steps of: depositing a second dielectric layer on the substrate and on the protective layer of the upper part of the fin channel structure, wherein the second dielectric layer comprises oxide; performing a planarization process on a upper surface of the second dielectric layer by applying the barrier layer as a stop layer; removing the barrier layer exposed after the planarization process; and removing the second dielectric layer, the protective layer, and the oxidized base part of the fin channel structure.

In some examples, forming the protective layer comprises steps of: forming a third dielectric layer on the fin channel structure and the substrate, wherein the third dielectric layer comprises oxide; and removing the third dielectric layer from the upper surface of the substrate except keeping the third dielectric layer on the top surface and the two sidewalls of the fin channel structure protection, wherein an etching process can be applied for removal.

In some examples, the method further comprises: sequentially forming a gate dielectric layer and a gate layer on the upper part of the fin channel structure to form a gate-all-around structure.

In some examples, the gate dielectric layer comprises a high-dielectric constant material; and/or wherein the gate layer comprises a metal gate material.

In some examples, the substrate comprises monocrystalline silicon.

According to another embodiment, a fin semiconductor device is provided, the device comprised a substrate and a fin structure protruding out on the substrate, wherein the fin structure comprises a fin source, a fin drain, and a fin channel connecting to the fin source and the fin drain, wherein the fin channel suspends over the substrate; wherein a gate-all-around structure is formed around the suspended fin channel; and wherein the suspended fin channel is manufactured by the method disclosed above.

In the method for manufacturing a fin semiconductor device provided in one aspect of the present application, a fin channel suspended over a substrate can be formed via a simple process, to facilitate the formation of a all-around gate in a subsequent process, thereby improving the performance of the fin field-effect transistor. In addition, the manufacturing method provided by the present application has a simple technical process and no additional manufacturing cost. The fin semiconductor device provided in another aspect of the present application has a fin channel suspended over a substrate and an all-around gate covering the suspended fin channel, effectively suppressing the short channel effect, effectively solving the electric leakage and punch-through problems, and thereby having relatively well device performance.

BRIEF DESCRIPTION OF THE DRAWINGS

By reading the detailed description of the embodiments of the present disclosure with reference to the following drawings, the above-mentioned features and advantages of the present application can be better understood. In the drawings, various components are not necessarily drawn to scale, and components with similar related characteristics or features may have the same or similar reference numerals.

DETAILED DESCRIPTION OF THE DISCLOSURE

The present application is described in detail below with reference to the drawings and specific embodiments. It should be noted that the following aspects described with reference to the drawings and specific embodiments are merely some examples and should not be construed as any limitation on the protection scope of the present application.

The present application relates to a fin semiconductor device and a manufacturing process thereof. More specifically, embodiments of the present application provide a manufacturing process of a fin semiconductor device. In the method for manufacturing a fin semiconductor device provided in one aspect of the present application, a fin channel suspended over a substrate can be formed via a simple process, to facilitate the formation of a all-around gate in a subsequent process, thereby improving the performance of the fin field-effect transistor. In addition, the manufacturing method provided by the present application has a simple technical process and no additional manufacturing cost. The fin semiconductor device provided in another aspect of the present application has a fin channel suspended over a substrate and an all-around gate covering the suspended fin channel, effectively suppressing the short channel effect, effectively solving the electric leakage and punch-through problems, and thereby having relatively well device performance.

The following description is provided to enable those skilled in the art to implement and use the present application and incorporate it into specific application contexts. Various modifications and various uses in different applications are apparent to those skilled in the art, and the general principles defined herein can be applied to a wide range of embodiments. Therefore, the present application is not limited to the embodiments provided herein, but should be granted the broadest scope consistent with the principles and novel features disclosed herein.

In the following detailed description, many specific details are set forth to provide a more thorough understanding of the present application. However, it is obvious to those skilled in the art that the practice of the present application may not necessarily be limited to these specific details. In other words, the well-known structures and devices are shown in block diagram forms and are not shown in detail, so as to avoid obscuring the present application.

Readers should be noted that all files and documents submitted with this specification and open to the public to consult this specification, and the contents of all of the files and documents are incorporated herein by reference. Unless otherwise stated directly, all the features disclosed in this specification (including any appended claims, abstract, and drawings) can be replaced by alternative features for achieving the same, equivalent, or similar purpose. Therefore, unless otherwise stated expressly, each feature disclosed is only an example of a set of equivalent or similar features.

It should be noted that when used, the left, right, front, rear, top, bottom, head, tail, clockwise, and counterclockwise signs are used for convenience only, and do not imply any specific direction. In fact, they are used to reflect the relative position and/or orientation between various parts of an object.

As used herein, the terms "over", "under", "between", and "on" refer to a relative position of one layer relative to another layer. Likewise, for example, a layer deposited or placed over or under another layer may directly contact the other layer or may be separated from the other layer by one or more intermediate layers. Moreover, a layer deposited or placed between layers may directly contact the layers or may be separated from the layers by one or more intermediate layers. In contrast, a first layer "on" a second layer is in contact with the second layer. In addition, a relative position of one layer relative to the other layers is provided (assuming that deposition, modification, and film removal operations are performed relative to a base substrate, regardless of the absolute orientation of the substrate).

Figure 1:
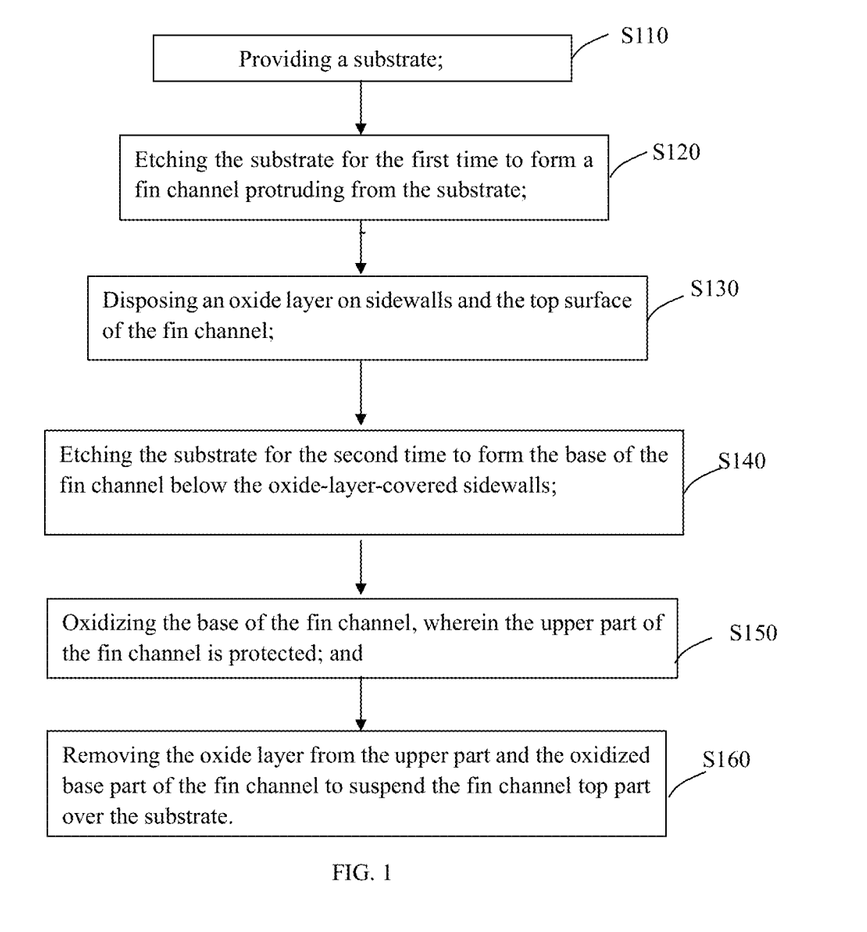
FIG. 1 illustrates a flowchart of a method for manufacturing a fin semiconductor device according to one embodiment of the present disclosure.

As stated above, in order to manufacture a fin field-effect transistor having a suspended fin channel and an all-around gate covering the suspended fin channel, one embodiment of the present application provides a manufacturing method as illustrated in FIG. 1. Specifically, the method for manufacturing a fin semiconductor device provided by the present application includes: step S110: providing a substrate; step S120: etching the substrate for the first time to form a fin channel protruding from the substrate; step S130: disposing an oxide layer on sidewalls and the top surface of the fin channel; step S140: etching the substrate for the second time to form the base of the fin channel below the oxide layer covered sidewalls; base part of the fin channel step S150: oxidizing the base of the fin channel, wherein the upper part of the fin channel is protected; and step S160: removing the oxide layer from the upper part and the oxidized base fin channel to suspend the fin channel top part over the substrate. base part of the fin channel upper part of the fin channel In step S110, the substrate can be a substrate material, including but not limited to monocrystalline silicon.

In step S120, the substrate provided in step S110 is patterned to form a protruding fin channel standing out from the substrate.

In a preferred embodiment of step S110, the substrate has got a first dielectric layer, such as oxide, on the upper surface of the substrate, and a barrier layer, likely made of a nitride, deposed on the oxide layer. In step S120, patterning by selective etching the substrate forms the fin channel protruding from the substrate, dielectric oxide layer meanwhile the first dielectric oxide layer and the barrier layer made of a nitride over the fin channel are retained, protected from the selective silicon etching.

The first dielectric oxide layer protects the top surface of the fin channel in the selective etching, and the barrier silicon nitride layer subsequently serves as an etching stop layer to control and ensure etching steps maintain a desirable flat top surface in later device process.

In step S130, a dielectric dielectric oxide layer is disposed on the upper surface of the substrate and the fin channel first, followed by selectively etching the dielectric oxide layer from the substrate. Meanwhile the dielectric oxide layer on the two sidewalls and the top surface of the fin channel are kept intact as a process protective layer.

In the above example where there are the first dielectric oxide layer and the barrier layer covering the fin channel, the protective layer formed in step S130 covers both the first dielectric oxide layer and the barrier layer.

In step S140, etching the substrate for the second time includes steps of: performing directional vertical dry etch on the substrate, the lower part of the fin channel will be etched downward into the substrate to form the base of the fin channel; and performing directional lateral dry etching on the base of the fin channel to reduce the lateral width dimension of the base of the fin channel.

In order to form a suspended upper part of the fin channel, the upper portion of the fin channel needs to separate from the substrate under the upper portion of the fin channel, so the base structure of the fin channel needs to be removed. According to the manufacturing method in this embodiment, upper part of the fin channel while protecting the base part of the fin channel under the protective layer, the base structure of the fin channel is exposed continuously to the directional vertical dry etching into the substrate, the remaining substrate connects to the base of the fin channel upper part of the fin channel which is still connected to the top part of the fin channel.

To disconnect the base part of the fin channel from the substrate, oxidation is applied to the base fin channel subsequently. upper part of the fin channel The upper fin channel is not affected during the oxidation process because it is covered by the protective layer. After the base part of the fin channel is fully oxidized, it can be removed in a selective etching process base part of the fin channel with a high selectivity ratio between monocrystalline silicon and oxide. The upper portion of the fin channel is then suspended after the base part of the fin channel is totally removed.

Furthermore, there is a concern that protection to the top part of the fin channel is not enough in the subsequent oxidation process, there may be a negative impact on the top part of the fin channel from the excessive long oxidation time in the subsequent oxidation process, an additional step is taken during the second time of vertical dry etch for exposing the base of the fin channel, base part of the fin channel, a lateral dry etch is performed on the base part of the fin channel to further effectively reduce the lateral dimension of the base part of the fin channel. By reducing the lateral dimension of the base part of the fin channel, the time taken for fully and completely oxidizing the base fin channel can be effectively reduced, thereby avoiding the negative impact on the upper part of the fin channel.

In step S150, as described above, the exposed base part of the fin channel has to be fully and completely oxidized, and during the oxidation process, it is necessary to ensure that the upper part of the fin channel is covered with the protective layer so it is not oxidized, i.e., to ensure that the upper part of the fin channel is not subjected to a negative impact.

In this embodiment, by controlling the thickness of the protective layer in the step of forming it, by controlling the reduced lateral dimension of the base part of the fin channel during lateral etching that part, and by controlling the oxidation time in the oxidation process, base part of the fin channel the full oxidation of the fin channel base part is achieved and the upper part of the fin channel upper part is kept intact.

In the process of oxidizing the base part of the fin channel, an upper portion of the substrate is inevitably oxidized. After this step, an oxide layer is disposed on the upper portion of the substrate, on the base part of the fin channel, and around the upper part of the fin channel.

In step S160, the oxide has to be removed from the upper portion of the substrate, from the base part, as well as from around the upper part of the fin channel. The oxide deposited on the upper portion of the substrate, on the base part and around the upper part of the fin channel presents irregular shapes, it is difficult to ensure that the oxide is completely removed in a controllable process by means of any existing methods. That is, there may be an oxide residue left outside the upper fin channel, so it is difficult to ensure the flatness of the upper surface of the substrate after the oxide is removed.

To control the oxide removal and to ensure thorough etch-off of the oxide from both around the upper part of the fin channel and the upper surface of the substrate, the step S160 of the manufacturing method provided in the embodiment of the present application further includes: depositing a second dielectric dielectric oxide layer on the substrate as well as on the protective layer already on the upper part of the fin channel. By forming the additional second dielectric oxide layer above the upper part of the fin channel, the previous irregularly shaped protective layer and the oxidized base part of the fin channel are fused into one regularly shaped second dielectric oxide layer. As the result it becomes easier for the subsequent etching.

As stated before, the upper part of the fin channel protrudes out from the substrate, although the second dielectric oxide layer has improved the flatness of the post-etch shape, the part of second dielectric oxide layer over the upper part of the fin channel is still inevitably higher than the layer other regions, at the end, the second dielectric oxide layer still is not even. To avoid any negative impact coming from the uneven surface after subsequent etching, after the step of forming the second dielectric oxide layer, the method further includes performing chemical mechanical polishing processing on the second dielectric oxide layer, to planarize the upper surface of the second dielectric oxide layer. In a preferred embodiment, the barrier layer which is composed of silicon nitride is disposed over the upper part of the fin channel upper part of the fin channel in the previous step, now in this step the silicon nitride barrier layer acts as the etch stop layer, so as to ensure successful planarization of the second dielectric oxide layer, without affecting the upper part of the fin channel.

After the planarization of the second dielectric oxide layer stopped at the nitride barrier layer, the exposed barrier layer can be removed. After the barrier layer is removed, the upper part of the fin upper part of the fin channel is surrounded by an oxide material, and the oxide material has a relatively regular shape. The oxide can be etched by means of an etching method to ensure that the oxide around the upper part of the fin channel is completely removed, so that the upper part of the fin channel can be completely exposed, thereby forming a suspended upper part of the fin channel and ensuring that the upper surface of the substrate is flat and even after the etch.

After the above steps, the upper part of the fin channel will be suspended. In an embodiment, the manufacturing method provided in one embodiment of the present application further includes sequentially depositing a gate dielectric layer and a gate layer around the upper part of the fin channel suspended over the substrate to form a gate-all-around structure. The gate dielectric layer may be formed of a dielectric material, including but not limited to an oxide or a high-dielectric-constant material, and the gate layer may be formed of a conductive gate material, including but not limited to metal tungsten or polysilicon.

Further reference is made to FIG. 2 to FIG. 12 for the manufacturing method provided in one embodiment of the present disclosure. FIGS. 2-12 illustrate schematic structural diagrams in the process of manufacturing the fin semiconductor device.

Figure 2:
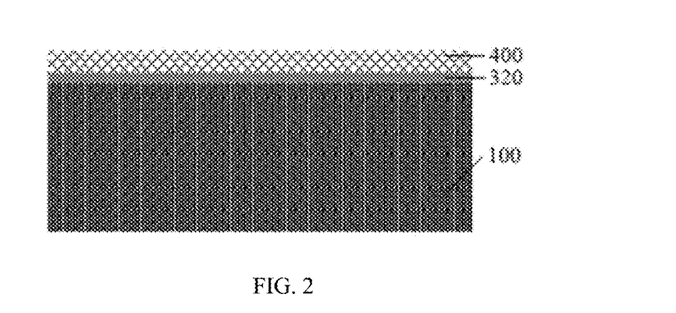
FIGS. 2-12 illustrate schematic structural diagrams in the process of manufacturing the fin semiconductor device according to one embodiment of the present disclosure.

First, reference is made to FIG. 2, which illustrates the structure of a substrate 100. The substrate is composed of a substrate material, including but not limited to monocrystalline silicon. In an embodiment shown in FIG. 2, a first dielectric oxide layer 320 is disposed on the upper surface of the substrate 100 and a barrier layer 400 composed of a nitride material is disposed on the first dielectric oxide layer 320.

Figure 3:
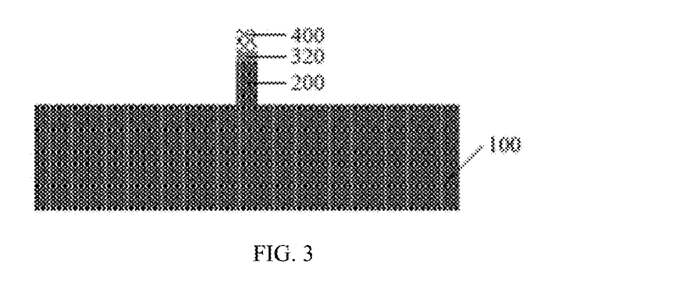

FIG. 3 illustrates the structure after patterning the fin channel stack 200/320/400 on the substrate 100. The post-etch structure shows as the patterned fin channel 200 and the stack of the oxide layer 320 and the nitride barrier layer 400 on the fin channel 200 protruding out from the substrate 100 and directly connected to the substrate 100. The first dielectric oxide layer 320 protects the top surface of the fin channel, and the silicon nitride barrier layer 400 subsequently acts as an etch stop layer to ensure that each future etching step in forming the device is under better control and the upper surface of each layer in the formed device is flat. In the preferred embodiment shown in FIG. 3, the stack of the first dielectric oxide layer 320 and the nitride barrier layer 400 on the upper surface of the substrate disposed before etching the substrate is patterned at the same time with the substrate, so the protruding fin channel 200 is capped by the stack of oxide and nitride layers.

Figure 4:
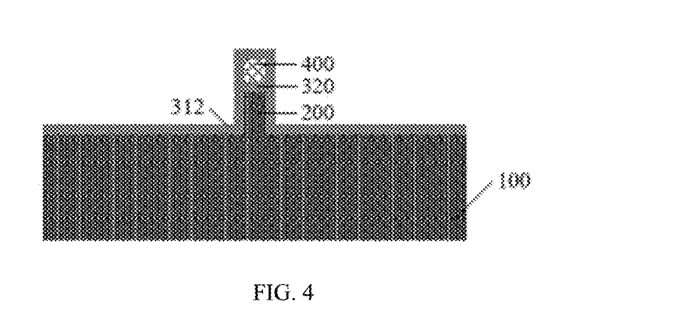
Figure 5:
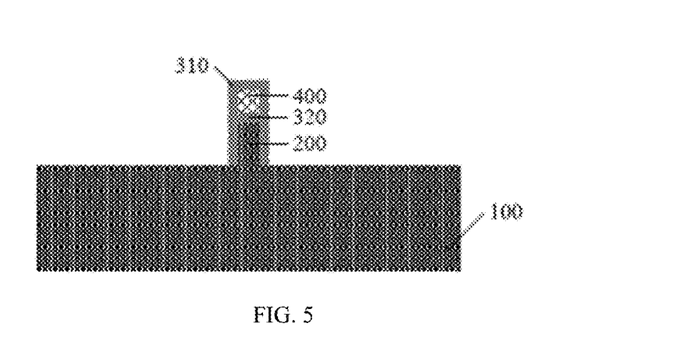

FIGS. 4 and 5 illustrate the structure in which a protective layer is disposed on the top surface and two sidewalls of the fin channel. Specifically, according to the manufacturing method provided in one embodiment of the present application, referring to FIG. 4, the formation of the protective layer may include first forming a third dielectric oxide layer 312 on the substrate 100 and the fin channel 200. The third dielectric oxide layer 312 also covers the first dielectric oxide layer 320 and the barrier layer 400 in the above preferred embodiment.

Subsequently, referring to FIG. 5, part of the third dielectric oxide layer 312 is removed by etching from the upper surface of the substrate 100, but the other parts of the third dielectric oxide layer on the top and the two sidewalls of the fin channel 200 are remaining as the protective layer 310.

Figure 6:
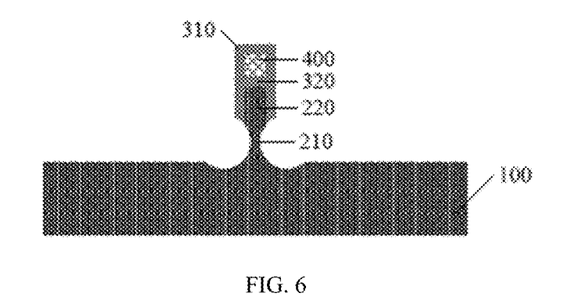

FIG. 6 illustrates the schematic structure after the second etching of the substrate. Referring to FIG. 6, a directional vertical dry etch on the substrate 100 results in extending the previous fin channel at its base into the substrate, the upper part of the fin channel 220 under the protection by the stack of layers, and the fin channel formed after the vertical etching is the base part of the fin channel 210. Further, if the vertical dry etch is performed only on the substrate, the width of the fin channel base 210 might be greater than the width of the upper part of the fin channel 220 due to the existence of the protective layer 310.

Further, in the manufacturing method provided in one embodiment of the present application, to reduce the lateral dimension of the base part of the fin channel 210, the second etch on the substrate also includes a lateral dry etch at the base part of the fin channel 210, as shown in FIG. 6.

To form a suspended upper part of the fin channel 220, the upper part 220 needs to be separated from the portion of the fin channel under the upper part, or the structure under the upper part of the fin channel has to be removed. According to the embodiment, since the upper part of the fin channel is protected by the protective layer, the fin channel structure under the upper part may be exposed by continuing the vertical etch of the substrate, that is, the remaining structure is the base part of the fin channel 210 under the upper part of the fin channel on the substrate, herein the base part 210 still connects to the upper part 220 of the fin channel.

To remove the base part of the fin channel 210, base part of the fin channelit may be oxidized subsequently. Since the upper part of the fin channel 220 is protected by the dielectric layer 310, the upper part of the fin channel 220 is not affected during the lower oxidation process. After the base fin channel 210 is oxidized, base part of the fin channelit may be selectively etched with an etchant having a high selectivity ratio between monocrystalline silicon and oxide, such that the upper part of the fin channel 220 can be released and then suspended.

Furthermore, although the upper part of the fin channel 220 is protected by the protective layer 310 in the subsequent oxidation process, to avoid a negative impact on the upper part of the fin channel 220 due to an excessive long oxidation time in the subsequent oxidation process, during the second etch on the substrate, on top of the vertical dry etch for exposing the base part of the fin channel 210, an additional lateral dry etch may also be performed on the base part of the fin channel 210 to effectively reduce the lateral dimension of the base part of the fin channel 210. By reducing the lateral dimension of the base part of the fin channel 210, the time for fully oxidizing the base part of the fin channel 210 will be effectively reduced, thereby avoiding the negative impact on the upper part of the fin channel 220.

Figure 7:
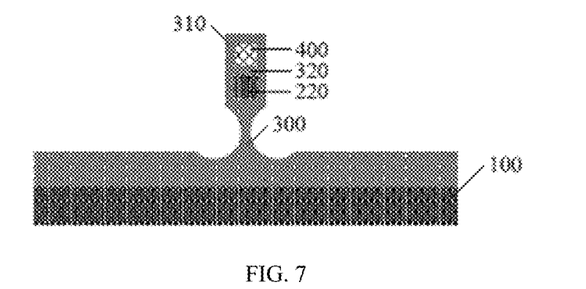

FIG. 7 illustrates a schematic structural diagram of fully and completely oxidizing the base part of the fin channel 210. It can be understood that, in the process of oxidizing the base part of the fin channel, an upper portion of the substrate is inevitably oxidized. After this step, an oxide 300 is provided on the upper portion of the substrate, on the base part of the fin channel, and around the upper part of the fin channel 220.

During the process of oxidizing the base part of the fin channel, it is necessary to ensure that the upper part of the fin channel 220 is protected by the protective layer 310 so is not oxidized, i.e., to ensure that the upper part of the fin channel 220 is not subjected to a negative impact.

In an embodiment, by controlling the thickness of the protective layer in the step of forming the protective layer 310, the reduced dimension of the base part of the fin channel 210 in the step of its lateral etching, and the oxidation time, it will ensure that the base part of the fin channel 210 is completely oxidized while not affecting the upper part of the fin channel 210.

In order to suspend the upper part of the fin channel 220, the completely oxidized base part of the fin channel needs to be removed. It can be seen from FIG. 7 that the oxide 300 on the upper portion of the substrate, on the base part of the fin channel, and around the upper part of the fin channel needs to be removed. That is, the shape of the oxide 300 is irregular. As to the irregularly shaped oxide 300, it is difficult to ensure that the oxide 300 is fully removed in a controllable way with any existing method. So there may be a residue of the oxide 300 outside the upper part of the fin channel 220, and it is difficult to ensure the flatness of the upper surface of the substrate after the oxide 300 is removed.

Figure 8:
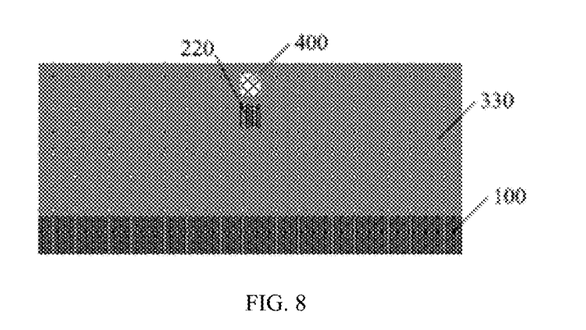

In order to enable the removal of the oxide 300 to be carried out in a controllable process, while it is ensured that the oxide around the upper part of the fin channel 220 is fully removed and the upper surface of the substrate 100 is flat after the oxide 300 is removed, step S160 of the manufacturing method described in the embodiment of the present application further includes: depositing a second dielectric oxide layer 330 covering the substrate 100 and the protective layer 310 on the top of the fin channel, referring to FIG. 8. By additionally forming the second dielectric oxide layer 330 above the upper part of the fin channel 220, so the previous irregularly shaped protective layer 310 and the oxide 300 at the base part of the fin channel can be fused into the regularly shaped second dielectric oxide layer 330. Therefore, the subsequent etching can be performed in an easier way.

It can be understood that, since the upper part of the fin channel 220 protrudes from the substrate, even if the second dielectric oxide layer 330 has improved the leveling, the second dielectric oxide layer 330 over the upper part of the fin channel 220 is inevitably uneven than other regions, that is, the second dielectric oxide layer 330 may have a bump. FIG. 8 only illustrates an ideally flat state after forming the second dielectric oxide layer 330.

In order to avoid a negative impact imposed by the protrusion on subsequent etching, after the step of forming the second dielectric oxide layer 330, the method further includes performing chemical mechanical polishing processing on the second dielectric oxide layer 330, so as to be planarize the upper surface of the second dielectric oxide layer 330. In a preferred embodiment, the barrier layer 400 made of silicon nitride is formed over the upper part of the fin channel 220 in a previous step, and the barrier layer 400 made of silicon nitride can be used as an etch stop layer in this step, so as to ensure that the second dielectric oxide layer 330 can be planarized successfully, without affecting the upper part of the fin channel 220.

Figure 9:
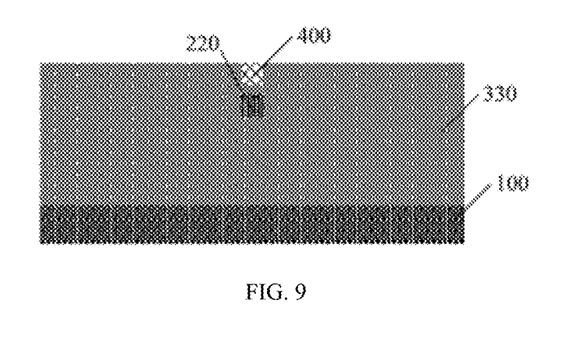
Figure 10:
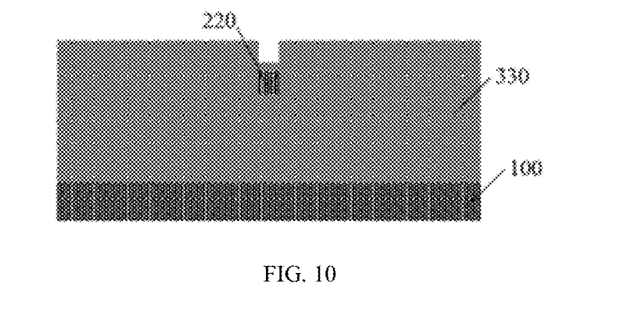

Referring to FIG. 9, the chemical mechanical polishing process is performed on the second dielectric oxide layer 330 by using the barrier layer 400 made of silicon nitride as an etching stop layer. After the chemical mechanical polishing step, the silicon nitride barrier layer 400 is exposed, which then can be removed, referring to FIG. 10. From the structure shown in FIG. 10, the oxide 300 around the upper part of the fin channel 220 has a rectangular shape. The oxide 300 can be etched by means of an etching method to ensure that the oxide 300 around the upper part of the fin channel 220 is completely removed, so that all sides of the upper part of the fin channel 220 can be exposed, thereby forming a suspended fin channel 220, meanwhile the upper surface of the substrate is flat and even leveled after the etch.

Figure 11:
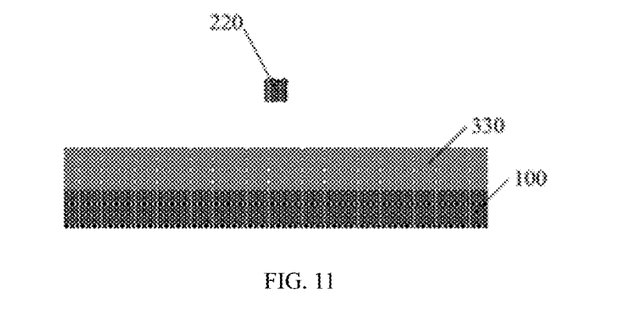

FIG. 11 illustrates the structure in which the oxide 300 around the upper part of the fin channel 220 is removed the upper part of the fin channel 220 is suspended. In this etching process, after the oxide 300 around the upper part of the fin channel 220 is completely removed, referring to FIG. 11, a portion of the oxide 300 over the substrate 100 can be retained, without affecting the upper part of the fin channel 220.

Figure 12:
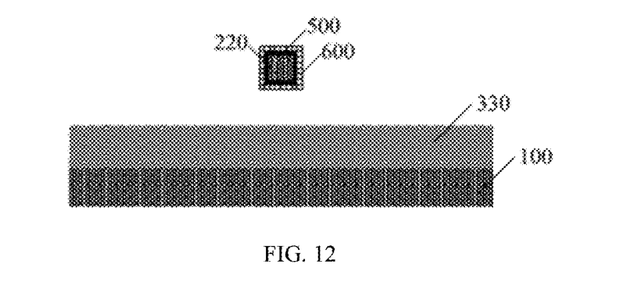

After the above steps, the upper part of the fin channel 220 is fully released and suspended. In an embodiment, the manufacturing method according to one embodiment of the present application, further includes sequentially depositing a gate dielectric layer 500 and a gate layer 600 around the upper part of the fin channel 220 suspended over the substrate 100 to form a gate-all-around structure as shown in FIG. 12. The gate dielectric layer 500 may be composed of a gate dielectric material, including but not limited to an oxide or a high-dielectric constant material, and the gate layer 600 may be composed of a gate material, including but not limited to metal tungsten or polysilicon.

So far, the manufacturing for manufacturing a fin semiconductor device provided in one embodiment of the present application has been described above. The manufacturing method provided in one aspect of the present application has a simpler technical process than existing ones and no additional manufacturing cost is added to it. In the method, a fin channel suspended over a substrate can be formed via a relatively simple technical process, to facilitate the formation of an all-around gate in a subsequent process, thereby improving the performance of the fin field-effect transistor.

Figure 13:
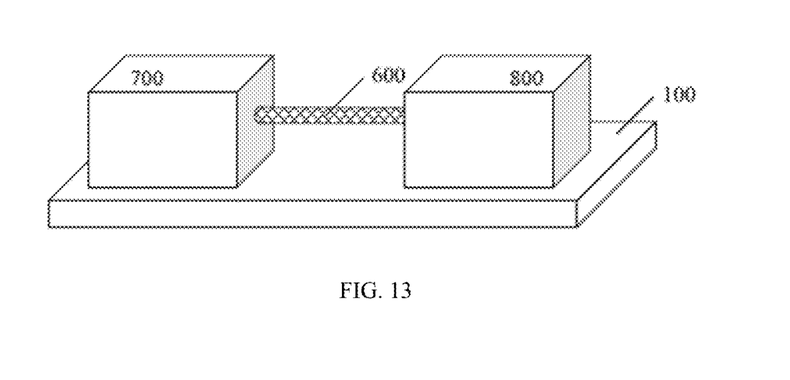
FIG. 13 illustrates a perspective view of a fin semiconductor device according to another embodiment of the present disclosure.

Another aspect of the present application provides a fin semiconductor device formed according to the above manufacturing method. Reference to made to FIG. 13 to understand the fin semiconductor structure provided in another aspect of the present application. Referring to FIG. 13, the fin semiconductor device includes a substrate 100 and a fin structure on the substrate 100 and protruding from the surface of the substrate. The fin structure includes a fin source 700, a fin drain 800, and a fin channel (wrapped by a gate layer 600 in FIG. 13) connecting the fin source 700 and the fin drain 800. The fin channel is a suspended channel suspended over the substrate 100. A all-around gate structure is formed around the suspended channel and includes a gate dielectric layer (wrapped by the gate layer 600 in FIG. 13) and the gate layer 600.

The fin semiconductor device provided in another aspect of the present application has a fin channel suspended over a substrate and a all-around gate covering the suspended fin channel, effectively suppressing the short channel effect, effectively solving the electric leakage and punch-through problems, and thereby having relatively well device performance.

So far, the fin semiconductor device and the manufacturing method thereof provided by the present application are described in detail. In the method for manufacturing a fin semiconductor device provided in one aspect of the present application, a fin channel suspended over a substrate can be formed via a simple process, to facilitate the formation of an all-around gate in a subsequent process, thereby improving the performance of the fin field-effect transistor. In addition, the manufacturing method provided by the present application has a simple technical process and no additional manufacturing cost. The fin semiconductor device provided in another aspect of the present application has a fin channel suspended over a substrate and an all-around gate covering the suspended fin channel, effectively suppressing the short channel effect, effectively solving the electric leakage and punch-through problems, and thereby having relatively well device performance.

Although the present disclosure is described with respect to specific exemplary embodiments, it is obvious that various modifications and changes can be made to these embodiments without departing from the broader spirit and scope of the present disclosure. Therefore, the specification and drawings should be construed as being illustrative rather than restrictive.

It should be understood that this specification will not be used to interpret or limit the scope or meaning of the claims. In addition, in the foregoing detailed description, it can be seen that various features are combined together in a single embodiment for the purpose of simplifying the present disclosure. The method of the present disclosure should not be construed as reflecting that the claimed embodiments require more features than those explicitly listed in each claim. On the contrary, as reflected in the appended claims, the inventive subject matter includes features less than all the features of a single disclosed embodiment. Therefore, the appended claims are hereby incorporated into the detailed description, with each claim independently used as an independent embodiment.

An embodiment or embodiments mentioned in the description are intended to be included in at least one embodiment of a circuit or method in combination with the specific features, structures, or characteristics described in the embodiment. The phrase "one embodiment" in various portions of the specification does not necessarily refer to the same embodiment.

What is claimed is:

1. A method for manufacturing a fin semiconductor device, comprising steps of:
   providing a substrate comprising a stack of layers on the substrate;
   etching the substrate to form a fin channel structure for a first time, wherein the fin channel structure protrudes from the substrate;
   forming a protective layer comprising a first portion on a top surface of the fin channel structure and a second portion on two sidewalls of the fin channel structure, wherein the protective layer comprises silicon oxide;
   etching the substrate for a second time having a combined vertical dry etch and a lateral dry etch, wherein the vertical dry etch extends the fin channel structure deeper into the substrate and removes lower parts of the second portion of the protective layer to expose the sidewalls of the fin channel structure, wherein the lateral dry etch reacts with the sidewalls of the fin channel structure to reduce a width of a base part of the fin channel structure without changing a width of an upper part of the fin channel structure;
   oxidizing the base part of the fin channel structure, without affecting the upper part of the fin channel structure;
   removing the protective layer from the fin channel structure; and
   removing the oxidized base part of the fin channel structure to suspend the upper part of the fin channel structure over the substrate.

2. The method for manufacturing according to claim 1, wherein the stack of layers on the substrate comprises a first dielectric layer on an upper surface of the substrate and a barrier layer on an upper surface of the first dielectric layer, wherein the first dielectric layer comprises oxide and the barrier layer comprises nitride;
   wherein etching the substrate for the first time further comprises:
   etching the substrate to form the fin channel structure, wherein the fin channel structure remains directly under the first dielectric layer.

3. The method for manufacturing according to claim 2, wherein the etching the substrate for the first time further comprises:
   etching the first dielectric layer and the barrier layer from the surface of the substrate; and
   wherein removing the protective layer and removing the oxidized base part of the fin channel structure further comprises:
   removing the first dielectric layer.

4. The method for manufacturing according to claim 2, wherein removing the protective layer and the oxidized base part of the fin channel structure further comprises steps of:
   depositing a second dielectric layer on the substrate and on the protective layer of the upper part of the fin channel structure, wherein the second dielectric layer comprises oxide;
   performing a planarization process on an upper surface of the second dielectric layer by applying the barrier layer as a stop layer;
   removing the barrier layer exposed after the planarization process; and
   removing the second dielectric layer, the protective layer, and the oxidized base part of the fin channel structure.

5. The method for manufacturing according to claim 2, wherein forming the protective layer comprises steps of:
   forming a third dielectric layer on the fin channel structure and the substrate, wherein the third dielectric layer comprises oxide; and
   removing the third dielectric layer from the upper surface of the substrate except keeping the third dielectric layer on the top surface and the two sidewalls of the fin channel structure protection, wherein an etching process can be applied for removal.

6. The method for manufacturing according to claim 1, wherein the method further comprises:
   sequentially forming a gate dielectric layer and a gate layer on the upper part of the fin channel structure to form a gate-all-around structure.

7. The method for manufacturing according to claim 6, wherein the gate dielectric layer comprises a high-dielectric constant material; and/or
wherein the gate layer comprises a metal gate material.

8. The method for manufacturing according to claim 1, wherein the substrate comprises monocrystalline silicon.

9. A fin semiconductor device, comprising a substrate and a fin structure protruding out on the substrate, wherein the fin structure comprises a fin source, a fin drain, and a fin channel connecting to the fin source and the fin drain,
wherein the fin channel suspends over the substrate;
wherein a gate-all-around structure is formed around the suspended fin channel; and
wherein the suspended fin channel is manufactured by the method according to claim 1.

* * * * *